(12) United States Patent
Schroers et al.

(10) Patent No.: US 11,255,895 B2
(45) Date of Patent: *Feb. 22, 2022

(54) SUPPLY SELF ADJUSTMENT FOR SYSTEMS AND METHODS HAVING A CURRENT INTERFACE

(71) Applicant: Infineon Technologies AG, Neubiberg (DE)

(72) Inventors: Christoph Schroers, Villach (AT); Christof Bodner, Villach (AT); Simon Hainz, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 20 days.

This patent is subject to a terminal disclaimer.

(21) Appl. No.: 16/881,290

(22) Filed: May 22, 2020

(65) Prior Publication Data

US 2020/0284829 A1    Sep. 10, 2020

Related U.S. Application Data

(60) Continuation of application No. 15/716,897, filed on Sep. 27, 2017, now Pat. No. 10,663,507, which is a
(Continued)

(51) Int. Cl.
*H04B 3/54* (2006.01)
*G01R 31/00* (2006.01)
*G08C 19/02* (2006.01)
*B60T 8/17* (2006.01)
*B60R 21/017* (2006.01)
(Continued)

(52) U.S. Cl.
CPC .............. *G01R 31/006* (2013.01); *B60L 3/00* (2013.01); *B60R 21/0173* (2013.01); *B60T 8/17* (2013.01); *B60T 8/171* (2013.01); *B60W 10/00* (2013.01); *G08C 19/02* (2013.01); *H04B 3/54* (2013.01)

(58) Field of Classification Search
CPC ...... H04B 3/548; G08C 19/04; G08C 19/025; G08C 19/16
See application file for complete search history.

(56) References Cited

U.S. PATENT DOCUMENTS 5,448,231 A    9/1995   Takezoe
6,480,402 B2   11/2002  Adragna
(Continued)

OTHER PUBLICATIONS

PS15 "Peripheral Sensor Interface for Automotive Applications." Technical Specification. V1.3. Jul. 29, 2008. 46 pages.
(Continued)

*Primary Examiner* — Harry R Behm
(74) *Attorney, Agent, or Firm* — Eschweiler & Potashnik, LLC (57) ABSTRACT

A sensor system having a current interface includes a supply and current interface, an electronic control unit and an enhanced initialization sensor. The supply and current interface is configured to receive a supply voltage. The electronic control unit is coupled to the supply and current interface. The enhanced initialization sensor is coupled to the supply and current interface. The enhanced initialization sensor is configured to initialize the supply and current interface at a suitable current level to mitigate erroneous information. measurement system.

13 Claims, 5 Drawing Sheets

Related U.S. Application Data division of application No. 14/193,150, filed on Feb. 28, 2014, now Pat. No. 9,784,779.

(51) Int. Cl.
*B60T 8/171* (2006.01)
*B60L 3/00* (2019.01)
*B60W 10/00* (2006.01)

(56) References Cited

U.S. PATENT DOCUMENTS

| | | | |
|---|---|---|---|
| 8,436,723 | B2 | 5/2013 | Siavoshani et al. |
| 10,663,507 | B2 * | 5/2020 | Schroers ............... B60L 3/00 |
| 2005/0269486 | A1 | 12/2005 | Ozawa |
| 2005/0280450 | A1 | 12/2005 | Shin |
| 2006/0044053 | A1 | 3/2006 | Tang |
| 2008/0053715 | A1 | 3/2008 | Suzuki |
| 2011/0080209 | A1 | 4/2011 | Kung |
| 2011/0313640 | A1 | 12/2011 | Hioki et al. |
| 2012/0277976 | A1 | 11/2012 | Skoff |
| 2013/0253774 | A1 | 9/2013 | Hammerschmidt |
| 2013/0271124 | A1 | 10/2013 | Kirkpatrick et al. |
| 2013/0275003 | A1 | 10/2013 | Uchino |
| 2014/0042996 | A1 | 2/2014 | Lau |
| 2014/0177284 | A1 | 6/2014 | Nakano |
| 2015/0333639 | A1 | 11/2015 | Strijker |

OTHER PUBLICATIONS

Notice of Allowance dated Jun. 16, 2017 for U.S. Appl. No. 14/193,150.
Final Office Action dated Mar. 11, 2016 for U.S. Appl. No. 14/193,150.
Non-Final Office Action dated Aug. 14, 2015 for U.S. Appl. No. 14/193,150.
Non-Final Office Action dated Mar. 18, 2019 for U.S. Appl. No. 15/7156,897.
Final Office Action dated Jul. 5, 2019 for U.S. Appl. No. 15/7156,897.
Non-Final Office Action dated Sep. 12, 2019 for U.S. Appl. No. 15/7156,897.
Final Office Action dated Nov. 25, 2019 for U.S. Appl. No. 15/7156,897.
Notice of Allowance dated Feb. 5, 2020 for U.S. Appl. No. 15/7156,897.

* cited by examiner

SUPPLY SELF ADJUSTMENT FOR SYSTEMS AND METHODS HAVING A CURRENT INTERFACE

REFERENCE TO RELATED APPLICATION

This application is a continuation of U.S. application Ser. No. 15/716,897 filed on Sep. 27, 2017 which is divisional of U.S. application Ser. No. 14/193,150 filed on Feb. 28, 2014, patented on Oct. 10, 2017 as U.S. Pat. No. 9,784,779, the contents of which are incorporated by reference in its entirety.

BACKGROUND

Automotive systems are complex systems that include computers and components to operate and monitor operation of automotive vehicles. The systems typically include a processor that controls and monitors engine operation and the like. The system generally operates various control systems that perform automotive functions. By monitoring, minor problems can be identified and corrected before becoming major problems.

Sensors are used in automotive systems to monitor characteristics or properties relevant to operation. The sensors then convey the information to an electronic control unit, which performs actions in response. The sensors monitor information such as speed, temperature, and pressure.

In interface systems using current, the sensor uses the same wires used to convey the information that are used to receive supply power. One common technique to convey the information to the ECU is to use first and second current levels to transfer the information digital. However, problems can occur if the supply power is insufficient.

DETAILED DESCRIPTION

The present invention will now be described with reference to the attached drawing figures, wherein like reference numerals are used to refer to like elements throughout, and wherein the illustrated structures and devices are not necessarily drawn to scale.

Systems and methods are disclosed that interface systems using multiple current levels, such as automotive systems. The systems and methods mitigate generation and transmission of erroneous information during initialization sequences.

Initialization or initialization sequences typically occur in interface systems when transitioning from an OFF or low power state to an ON state. For example, an automotive interface system may initialize upon starting a car.

Figure 1:
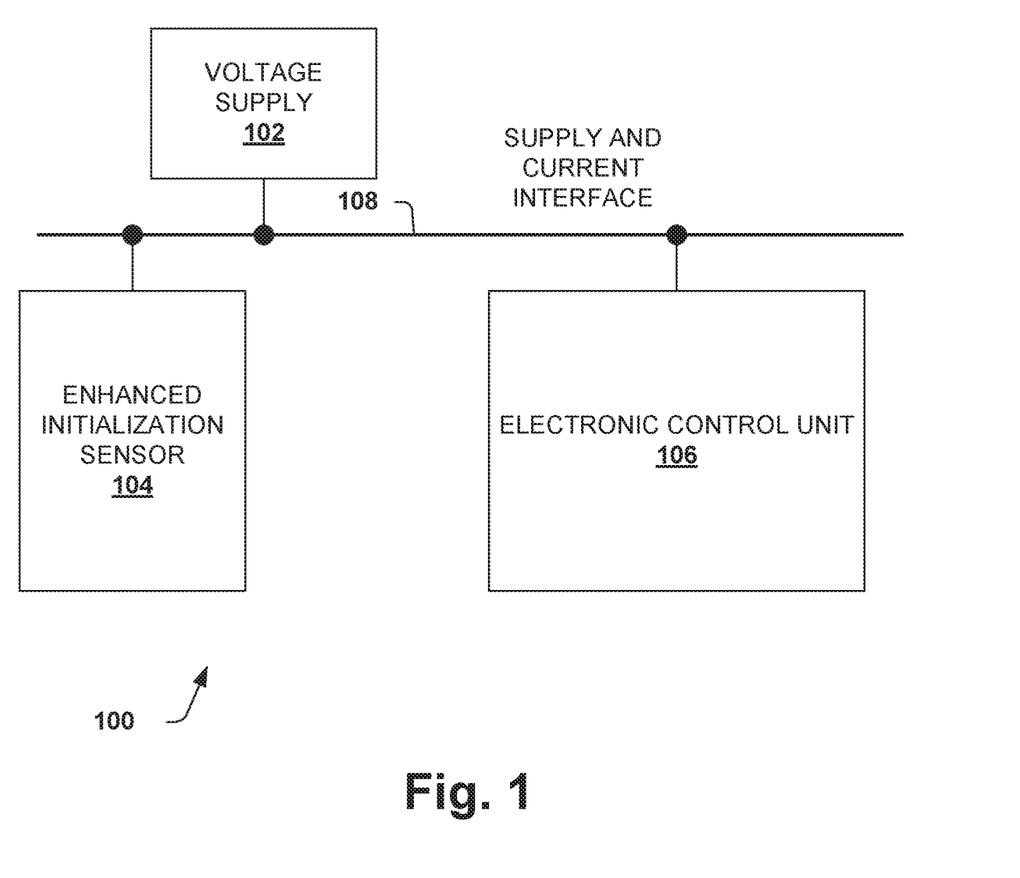
FIG. 1 is a diagram illustrating a sensor system using a current interface.

FIG. 1 is a diagram illustrating a sensor system 100 having a current interface. The interface uses multiple current levels to transfer information. The system 100 initializes a standard current for the interface to a suitable level that compensates for hysteresis and mitigates the transfer of inaccurate or erroneous information.

The system 100 includes a voltage supply 102, an enhanced initialization sensor 104, an electronic control unit 106 and a supply and current interface 108. The voltage supply 102 provides a DC power source at voltage. Generally, for automotive applications the voltage is about 11 to 12 Volts DC. The voltage supply 102 can be provided by a suitable power source, such as an automotive battery, lead acid battery, alternator, and the like.

The supply and current interface 108 is a multipurpose set of wires or lines that provide both power and data transfer by current levels. The interface 108 is coupled to the voltage supply 102, which provides the DC power to other components coupled to the interface 108.

The electronic control unit (ECU) 106 operates as a controller for the system 100. The unit 106 transfers data, including control information, with other components in the system. The ECU 106 is configured to store information, analyze information, determine responses, control sensors and components, and the like. For example, the ECU 106 can be configured to adjust a throttle according to received information from sensors on velocity. As another example, the ECU 106 can be configured to activate air bag deployment in response to information from a pressure sensor.

It is appreciated that if information received by the ECU 106 is inaccurate, problems can occur. For example, if rotations per minute (RPM) are incorrect, an improper speed is determined. If a fuel sensor doesn't initialize properly, the amount of remaining fuel may be determined improperly.

The enhanced initialization sensor 104 is configured to measure one or more characteristics or properties and provide the measured information to the ECU 106 by the supply and current interface 108. The measured characteristics or properties can include, for example, pressure, temperature, motion, magnetic fields, and the like. Further, the sensor 104 can be a pressure sensor, antilock brake sensor (ABS), and the like. The sensor 104 receives power from the voltage supply 102, also by way of the supply and current interface 108.

In one example, the measured information is based on a signal derived from changes in a magnetic field. For example, a pole wheel or the like may be used to generate magnetic fields that vary according to a rotational speed of an automotive wheel.

It is appreciated that the voltage supply 102 includes intermittent supply. For example, a car battery and/or alternator may fail at least temporarily causing the voltage supply 102 to fall below a level required for proper operation of the sensor 104. This level is also referred to as a reset level and provides a threshold where the sensor 104 is more likely to provide incorrect measured information. If the level is below the reset level, the sensor 104 doesn't have enough voltage or power to perform properly. The measured information may omit information or provide incorrect information.

The enhanced initialization sensor 104 includes enhanced initialization functionality. Thus, when the voltage supply 102 is restarted or reactivated, the sensor 104 initializes to a standard/default current at a suitable current level. This occurs when the voltage supply 102 has risen to or above a release threshold. The suitable level is selected so as to be high enough to mitigate erroneous transmissions and/or erroneous data. The release threshold is typically slightly above the reset threshold. In one example, the suitable current level is set to a highest current level for an interface protocol. The protocol has a plurality of current levels. Additionally, the sensor 104 initializes to a suitable voltage value associated with the suitable current. The suitable voltage is high enough to also mitigate the voltage supply 102 falling to the reset level.

In another example, an interface protocol uses a current level of 7 mA and a current level of 14 mA for transferring data. In this example, once the voltage supply 102 rises to at least the release threshold, the current level is set to the suitable level of 14 mA instead of 7 mA. As a result, any change in current across the interface 108 is to use a lower current. The lower current necessarily leads to an increase in the voltage level of the voltage supply 102. Otherwise, for example, an increase in the interface current leads to a decrease in the voltage level, which can lead to insufficient operating voltage for the sensor 104 and/or resetting the sensor 104. Thus, the initialization process of setting the current to a suitable level avoids or mitigates unnecessarily resetting the sensor 104 and providing incorrect data.

Resetting the sensor 104, particularly during or right after initialization, can lead to current variation waveforms that look like measured data or other information, but in actuality are not. This erroneous information can even be misinterpreted by the ECU 106 and cause improper actions to be taken or required actions not to be performed.

Figure 2:
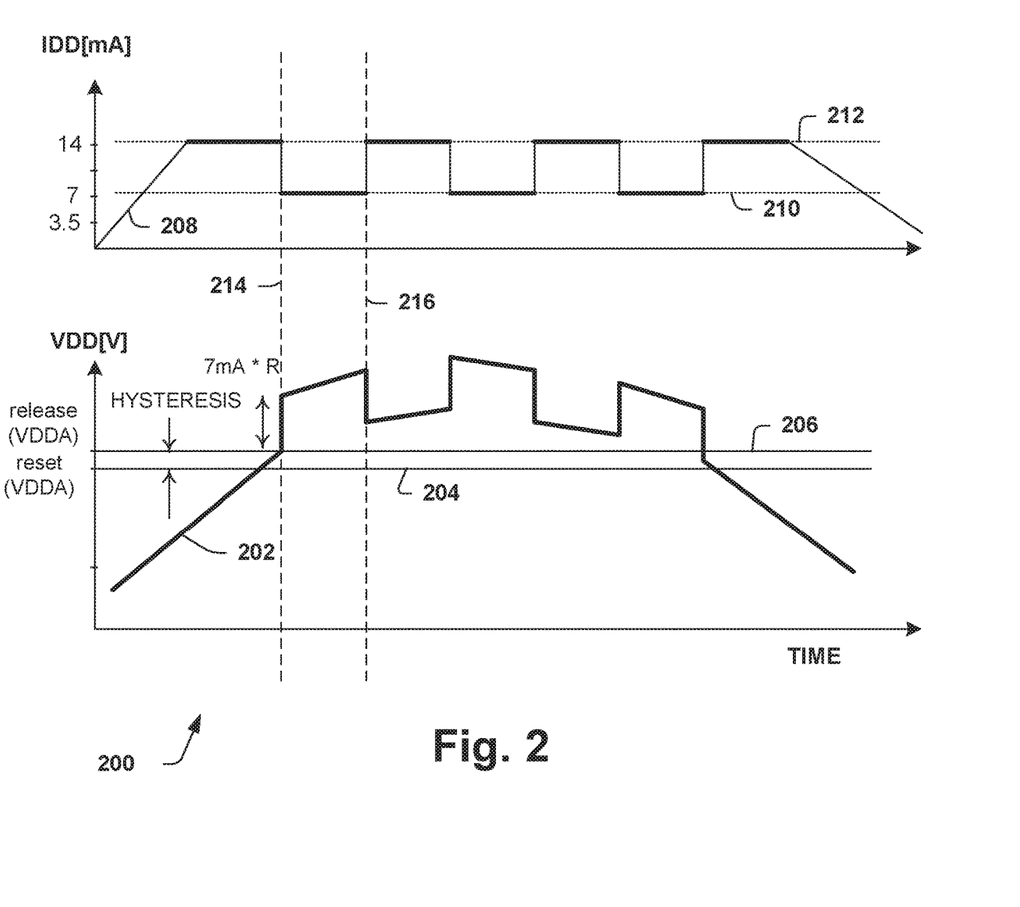
FIG. 2 is a graph depicting examples of voltage and current levels for an enhanced initialization sensor.

FIG. 2 is a graph 200 depicting examples of voltage and current levels for an enhanced initialization sensor. The examples are described with reference to the sensor 104 and system 100 of FIG. 1, described above. However, it is appreciated that variations of the system 100 are contemplated. Further, it is appreciated that the values shown in the graph are provided for illustrative purposes and that other suitable values may be used with the system 100 and variations thereof.

The graph 200 is described in terms of current IDD and voltage VDD of a supply and current interface, such as the interface 108, coupled to an enhanced sensor, such as the enhanced sensor 104. The current IDD is provided in mA and the voltage VDD is provided in volts.

An upper portion of the graph 200 depicts IDD along a Y-axis and time along an X-axis. A lower portion depicts VDD along a Y-axis and time along an X-axis. The upper and lower portions show the IDD and VDD of the interface at points in time along the Y-axis.

Initially, on the left, the VDD and IDD start at or near zero. This could be for a battery or other power source slowly turning on its supply of power to a voltage supply coupled to the interface. As the voltage increases, the enhanced initialization sensor 104 starts increasing the current IDD. The IDD continues to increase as the VDD increases until the IDD reaches the suitable/default level of 212, which in this example is 14 mA. The level 212 is also a highest current level of an interface protocol. The VDD continues to increase until the VDD reaches the release threshold 206. Until the VDD reaches the release threshold 206, the sensor 104 is inactive in that it does not provide measured information and/or transmit data.

Upon reaching the release threshold 206, the sensor 104 can start providing information. In this example, the sensor 104 begins transmitting measured data by adjusting current levels of the IDD. The sensor 104 uses the upper level 212 and a lower level 210 in this example. Upon reaching the release threshold, the sensor 104 has driven the IDD to the upper level 212, thus the only possible change in the IDD is to a lower current, which results in an increase in VDD. As a result, undesirably lowering the VDD to the reset level 204 is mitigated.

An increase in IDD causes a decrease in VDD and a decrease in IDD causes an increase in VDD. This change is due to the change in current level multiplied by a demodulation resistor used in the electronic control unit. In this example, there is an increase in the VDD. In this example, at time 214, the change is a decrease in IDD, which leads to an increase in VDD. Additionally, the voltage at 214 is also referred to as a suitable or safe voltage in that a later increase in current, such as at 216, is generally not likely to or does not fall to the reset threshold 204.

At a second time 216, there is an increase in IDD, which leads to a decrease in VDD. However, by this time 216, the voltage supply 102 has sufficiently initialized that the VDD does not fall to the reset threshold 204.

The depicted example does eventually show a decrease in VDD where VDD falls to the reset threshold. At this point, the sensor 104 is deactivated and providing of the measured data is halted.

Figure 3:
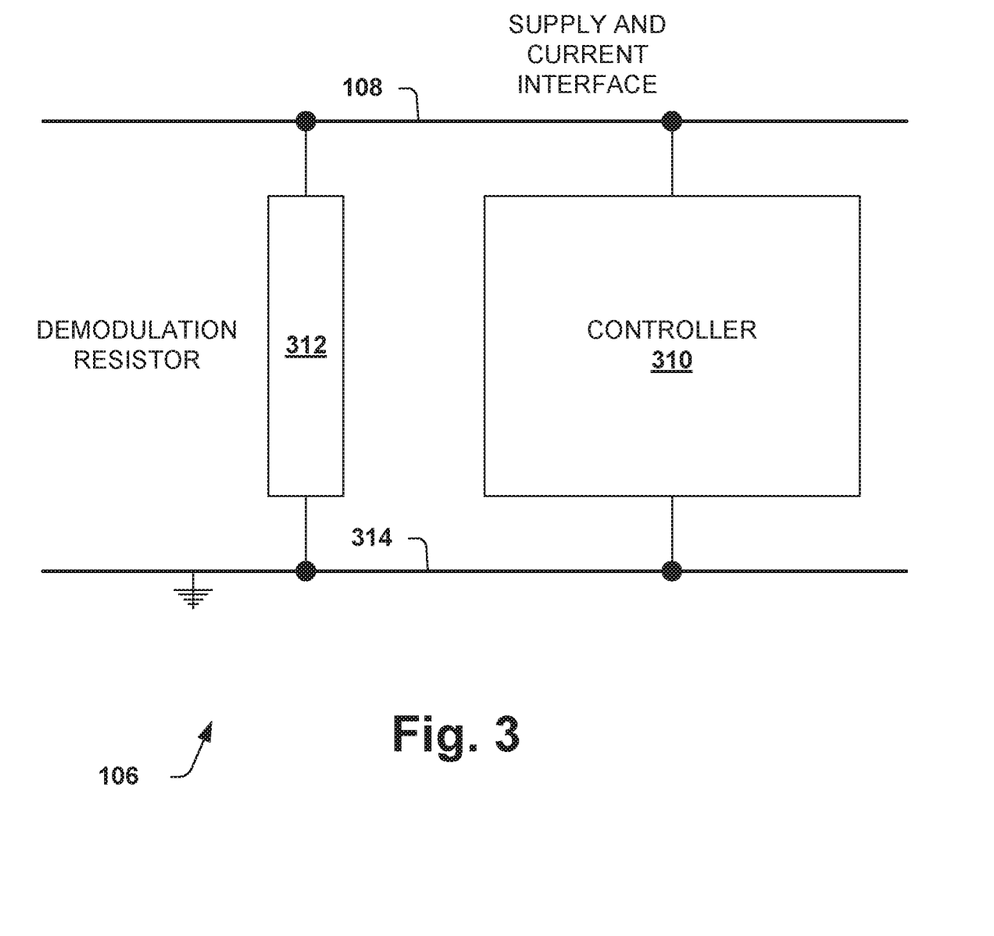
FIG. 3 is a block diagram illustrating an electronic control unit.

FIG. 3 is a block diagram illustrating an electronic control unit 106. The electronic control unit (ECU) 106 can be utilized with the system 100, described above. The unit 106 is described here with additional details for illustrative purposes. However, it is appreciated that variations of the electronic control unit 106 are contemplated.

The ECU 106 includes a demodulation resistor 312 and a controller 310. Other components, such as a memory, interface, and the like may also be present. The ECU 106 is coupled to a supply and current interface 108 and to ground 314. By using the interface, the ECU 106 is configured to transfer data, including control information, measured information, and the like, with other components of the system.

The controller 310 includes a processor or other circuitry configured to receive information and control other components and is connected to the interface 108 and ground 314. The ground 314 is considered to be part of the interface 108. The controller 310 is configured, in one example, to store information, analyze information, determine responses, control sensors, and the like. The controller obtains measured information by current levels of the supply and current interface 108.

The demodulation resistor 312 is also coupled to the interface 108 and the ground 314. In order to maintain suitable levels, the demodulation resistor 312 has a selected resistance value. The resistor 312 can be configured or sized to mitigate unwanted fluctuations at the interface 108. The resistance value is typically within a specified range, but can vary. For example, one manufacturer may use a resistor with a resistance of 15 ohms while another may use a resistance of 75 ohms. However, other components coupled to the interface 108 generally assume or are designed for the largest possible resistance. This can lead to wasted power consumption, operating voltage, and the like. The system 100 and the enhanced interface 104 are not required to be based on the largest resistance of the protocol as it is more tolerant.

Figure 4:
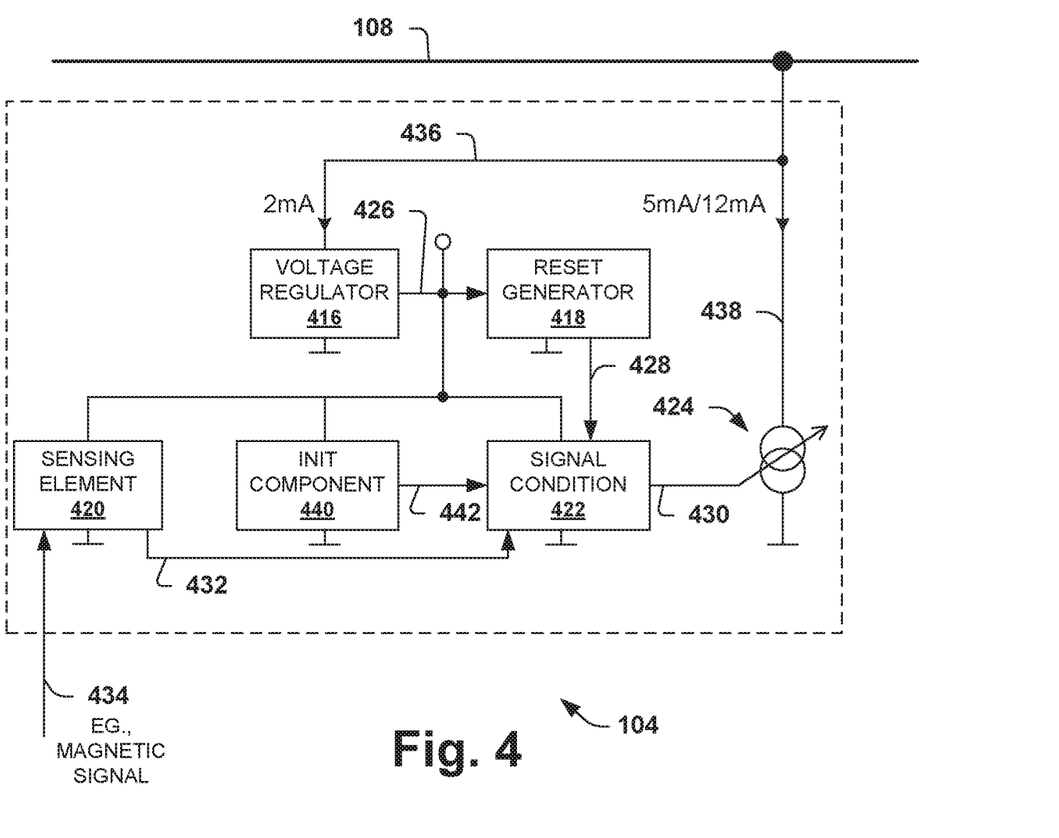
FIG. 4 is a block diagram illustrating an enhanced sensor that can be utilized with the system.

FIG. 4 is a block diagram illustrating an enhanced sensor 104 that can be utilized with the system 100. The enhanced sensor 104 is configured to measure one or more characteristics or properties and to provide the measured information to other components, such as the ECU, by a supply and current interface.

The enhanced sensor 104 is described with additional details for illustrative purposes. It is appreciated that variations are permitted.

The sensor 104 is coupled to a supply and current interface 108. The interface provides power and is also used to transfer data, including providing measured information.

The sensor 104 includes a voltage regulator 416, a reset generator 418, a signal conditioning component 422, an initialization component 440, a sensing element 420, and a controllable current component 424.

The voltage regulator 416 receives power 436 from the interface 108 and is configured to provide a regulated power 426. In one example, the received power is at a voltage level of about 10-13 volts and the regulated power is at about 3-5 volts. The reset generator 418 is configured to turn off data transfer if the regulated power 426 is insufficient and turn ON data transfer if the regulated power 426 is sufficient. If the regulated power 426 is insufficient, the other components of the system 400 may operate improperly and supply erroneous data. Thus, the reset generator 418 mitigates transfer of erroneous data by comparing the regulated power 426 with a reset threshold and a release threshold. The release threshold is selected so that regulated power 426 falling below the threshold could or is likely to lead to erroneous data. Upon the regulated power 426 being insufficient or at or below the reset threshold, the reset generator 418 sends a signal 428 to the signal conditioning component 422 indicating a RESET. Upon the regulated power 426 being sufficient or at or above the release threshold, the reset generator 418 sends a signal 428 to the signal conditioning component 422 indicated a RELEASE.

The signal conditioning component 422 is configured to provide a condition signal 430 to the controllable current component 424. The condition signal 430 sets the current component 424 to a selected current level of a plurality of current levels. In one example, the plurality of current levels include 5 mA and 12 mA, 7 mA and 14 mA, and the like.

The signal conditioning component 422 provides the signal 430 based on one or more inputs, including an initialization signal 442 and a sensing signal 432. The sensing signal 432 indicates the selected level based on a sensed property. The initialization signal 442 supersedes the sensing signal and sets the selected level to be at a suitable current level of the plurality of current levels. In one example, the initialization signal 442 is set to a highest current level of the plurality of current levels.

As stated above, the sensing element 420 generates the sensing signal 432 based on a sensed property and/or characteristic 434, such as a magnetic signal. The sensing signal 432 modulates or varies the selected level to convey measured information. The sensing element 432 can be a pressure sensor, magnetic/speed sensor, temperature sensor, and the like. The sensing element 420 is powered by the regulated power 426.

The initialization component 440 is configured to generate the initialization signal 442 to set the selected level to the suitable level at the time of initialization. During initialization, the signal conditioning component 422 receives the regulated power 426, however the power 426 is typically not high enough. This information is provided by the reset signal 428. Once the reset signal is OFF, the initialization component 440 sets the initialization signal 442 to select the suitable level for a period of time, such as a clock cycle or a portion of a clock cycle. After the period of time, the initialization signal 442 does not set the selected current level and normal operation is assumed.

The initialization component 440 sets the suitable level to a value that mitigates a subsequent reset due to a voltage drop over the next cycle or two. The suitable level is set to avoid an increase or substantial increase in current consumed at the interface 108 over the next cycle or two. The component 440 is shown as a separate component in FIG. 4, however it is appreciated that its functionality can be integrated into other components, such as the signal conditioning component 422.

The controllable current component 424 sinks current 438 at a plurality of levels according to the signal 430. The current 438 is varied to convey information across the interface 108. In one example, the interface 108 uses a first level at 7 mA and a second level at 14 mA. The voltage regulator 416 consumes about 2 mA of current 436. Thus, the current 438 is varied from 5 mA to 12 mA to yield the first and second levels.

The enhanced sensor 104 mitigates transferring erroneous data by setting its current to a suitable current level. This mitigates improper or undesired resets due to increases of current that lead to decreases in supply voltage of the interface 108. Additionally, this is accomplished without a need to monitor the voltage of the interface 108.

Figure 5:
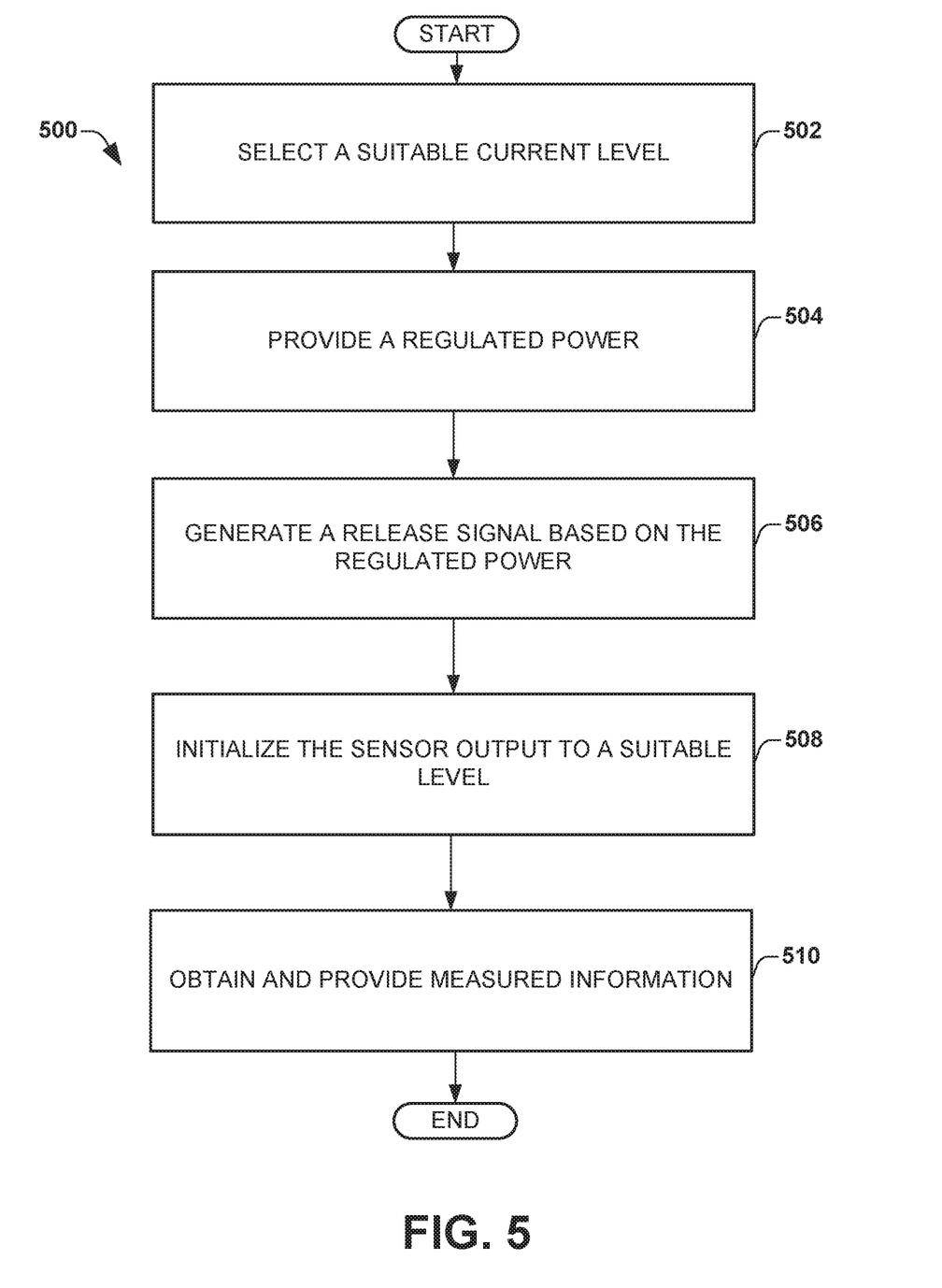
FIG. 5 is a flow diagram illustrating a method of operating a current interface.

FIG. 5 is a flow diagram illustrating a method 500 of operating a current interface. The method 500 initializes a current level or output of an enhanced sensor in order to mitigate providing erroneous data.

The method begins at block 502, wherein a suitable current level for an enhanced sensor is selected. The suitable current level is selected to mitigate a voltage drop at an interface and to maintain the voltage at the interface at a level above a reset threshold. In one example, the suitable current level is selected to be a highest level of a plurality of current levels used for the interface.

A voltage regulator provides a regulated power at block 504. The regulated power typically starts at a lower voltage and gradually increases toward a final voltage. The regulated power is at a lower voltage than a supply voltages and is used by one or more components within the enhanced sensor.

A release signal is generated by a signal conditioning component upon the regulated power increasing to or beyond a release threshold at block 506. This threshold is a voltage at which components of the enhanced sensor typically operate. The release threshold is above the reset threshold, but may be below the final voltage.

The sensor output is initialized to the suitable level at block 508. The sensor output is initialized to the suitable level prior to the occurrence of conveying measured information. In one example, the sensor output is initialed prior to the release signal. An initialization component configures the signal condition component to set the sensor output to the interface at the suitable level for a period of time. The period of time is also selected to mitigate a voltage drop at the interface below the reset threshold.

A sensor obtained measured information and the signal conditioning component varies the current level of the sensor output to provide the measured information at block 510. The measured information is conveyed via the interface, such as the interface 108 described above, to other components, such as an electronic control unit.

While method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown in FIGS. 1, 2, etc., are non-limiting examples of system that may be used to implement method(s)). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A sensor system having a current interface includes a supply and current interface, an electronic control unit and an enhanced initialization sensor. The supply and current interface is configured to receive a supply voltage. The electronic control unit is coupled to the supply and current interface. The enhanced initialization sensor is coupled to the supply and current interface. The enhanced initialization sensor is configured to initialize the supply and current interface at a suitable current level to mitigate erroneous information.

An enhanced initialization sensor system is disclosed. The system includes a voltage regulator, a signal conditioning component and an initialization component. The voltage regulator is configured to receive a supply voltage from an interface and to provide a regulated power. The signal conditioning component is configured to receive the regulated power and to control a current level based on one or more inputs. The initialization component is configured to receive the regulated power and to initialize the signal conditioning component to a suitable current level.

A method of operating a current interface is disclosed. A regulated power is provided. A release signal is generated upon the regulated power reaching a release threshold. A sensor output is initialized to a suitable current level by a signal conditioning component. Additionally, an interface coupled to the sensor output is set to the suitable current level.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of operating an interface, the method comprising:
   generating a release signal upon a regulated power reaching a release threshold;
   generating a reset signal upon the regulated power dropping below a reset threshold, wherein the reset threshold is lower than the release threshold and non-zero;
   selecting an initialization level as a highest level of a plurality of current levels of the interface;
   initializing a sensor output to a suitable current level by a signal conditioning component prior to the release signal being generated and maintaining the suitable current level by the signal conditioning component at least until the release signal is generated, wherein the suitable current level is the selected initialization level; and
   providing measured information to an electronic control unit via the interface by varying the sensor output between two current levels of the plurality of current levels of the interface once the release signal is generated and until the reset signal is generated.

2. The method of claim 1, further comprising setting the interface to the suitable current level.

3. The method of claim 1, further comprising selecting the suitable current level to mitigate the regulated power falling below the reset threshold.

4. The method of claim 1, further comprising selecting the suitable current level to mitigate erroneous transmissions.

5. The method of claim 1, wherein the sensor output is initialized to the suitable current level by the signal conditioning component when the regulated power rises above the reset threshold.

6. The method of claim 1, further comprising initializing the sensor output to a selected voltage associated with the suitable current level.

7. The method of claim 1, further comprising halting the providing of the measured information to the electronic control unit upon the reset signal being generated.

8. A method of operating an interface, the method comprising:
   generating a regulated power based on an interface power;
   generating a reset signal when the regulated power falls below a non-zero reset threshold;
   selecting an initialization level as a highest level of a plurality of current levels;
   adjusting a current level of the interface to the initialization level when the regulated power rises above the non-zero reset threshold; and
   providing measured information obtained by a sensor to the interface by varying the current level of the interface between two current levels of the plurality of current levels until the reset signal is generated.

9. The method of claim 8, further comprising generating a release signal when the regulated power rises above a release threshold.

10. The method of claim 9, wherein the measured information is provided to the interface once the release signal is generated.

11. The method of claim 9, further comprising maintaining the current level of the interface at the initialization level at least until the release signal is generated.

12. The method of claim 8, further comprising halting the providing of the measured information to the interface upon the reset signal being generated.

13. The method of claim 12, further comprising deactivating the sensor upon the reset signal being generated.

\* \* \* \* \*